United States Patent [19]

Downes et al.

[11] Patent Number: 5,589,669

[45] Date of Patent: Dec. 31, 1996

[54] ELECTRICAL CONTACT FOR PRINTED CIRCUIT BOARDS

[75] Inventors: Stuart D. Downes, Milford; Leonard A. Merrill, Millis, both of Mass.

[73] Assignee: EMC Corporation, Hopkinton, Mass.

[21] Appl. No.: 579,773

[22] Filed: Dec. 28, 1995

[51] Int. Cl.$^6$ ............................................. H05K 1/02
[52] U.S. Cl. ....................... 174/266; 439/82; 174/262; 174/261; 174/250
[58] Field of Search ........................... 174/266, 265, 174/262, 261, 250, 267; 361/791, 774; 439/75, 46, 45, 82; 29/847

[56] References Cited

U.S. PATENT DOCUMENTS

| | | |
|---|---|---|
| 296,253 | 4/1884 | Vail . |
| 3,601,750 | 8/1971 | Mancini .................................. 339/17 |
| 4,443,053 | 4/1984 | Astbury .................................. 339/221 |
| 4,505,529 | 3/1985 | Barkus .................................. 336/17 M |
| 4,516,103 | 5/1985 | Arnold .................................. 336/65 |
| 4,562,301 | 12/1985 | Kameda et al. ........................ 174/68.5 |
| 4,596,437 | 6/1986 | Rush .................................... 339/221 R |
| 4,691,971 | 9/1987 | Hahn .................................... 439/78 |
| 4,740,166 | 4/1988 | Barnhouse ............................. 439/82 |
| 4,746,301 | 5/1988 | Key ...................................... 439/82 |
| 4,758,187 | 7/1988 | Guglhör ................................ 439/741 |
| 4,776,807 | 10/1988 | Triner et al. .......................... 439/82 |
| 4,795,378 | 1/1989 | Tomizu et al. ........................ 439/751 |
| 4,861,944 | 8/1989 | Jones, II et al. ...................... 174/68.5 |
| 4,878,861 | 11/1989 | Kendall et al. ........................ 439/751 |
| 4,889,496 | 12/1989 | Neidich ................................ 439/75 |
| 5,410,452 | 4/1995 | Sinclair et al. ........................ 361/791 |

*Primary Examiner*—Laura Thomas
*Attorney, Agent, or Firm*—Wolf, Greenfield & Sacks, P.C.

[57] ABSTRACT

An electrical pin contact for mounting on a printed circuit board to provide an electrical interconnection to the printed circuit board. The contact includes an elongated, conductive pin, and a base attached to one end of the pin. The base has a triangular cross-section with vertices that engage a plate-through hole to support the contact in the plated-through hole during a soldering process. The contact may include a flange or stops to support the contact on a printed circuit board. The contact may also include a tail extending from the base opposite the pin.

17 Claims, 3 Drawing Sheets

ELECTRICAL CONTACT FOR PRINTED CIRCUIT BOARDS

BACKGROUND OF THE INVENTION

1. Field of the Invention

The present invention relates to electrical contacts, and more particularly to an electrical contact for mounting on a printed circuit board.

2. Description of the Related Art

Electrical pin contacts have been developed to provide an electrical interface between a printed circuit board and other electronic components. Electrical pin contacts can be used to establish an electrical interconnection to circuitry on a printed circuit board through a plated-through hole on the printed circuit board to which the circuitry is connected. For example, the pin contacts can provide a direct connection between two printed circuit boards, wherein each end of the contact makes an electrical connection to the printed circuit boards. As another example, a pin contact can provide an interface for an electrical connector to interconnect a printed circuit board to other electronic components.

In general, electrical pin contacts for printed circuit boards can be categorized as either a solder contact or a solderless contact. For either type of contact, it is desirable that the contact contribute to both the mechanical and electrical integrity of the joint between the contact and the printed circuit board.

For solder contacts, the solder joint itself typically contributes toward a significant portion of both the mechanical and electrical integrity between the contact and the plated-through hole on the printed circuit board. Although a solder joint can provide adequate mechanical support for the contact, the integrity of the solder joint can be compromised unless the contact is properly supported in the plated-through hole during the soldering process. In particular, as solder transforms from the liquid phase to the solid phase, it passes through a plastic phase during which time movement of the electrical contact relative to the plated-through hole can introduce fractures into the solder joint that could ultimately cause failure of the solder joint.

In an effort to improve the overall integrity of solder joints, electrical pin contacts have been developed which provide mechanical support between the contact and a plated-through hole. In addition to inhibiting movement when being soldered to the plated-through hole of the printed circuit board, these contacts can also reinforce the structure of the solder joint. However, solder contacts typically rely upon either deformation of a portion of the contact after insertion into a hole which requires additional manufacturing steps, or an interference fit which results in deformation of a substantial portion of the hole. Examples of these contacts include U.S. Pat. Nos. 3,601,750 and 5,410,452. Mancini, in the '750 patent, discloses a square pin contact having a cylindrical ferrule placed over and secured to each corner of the contact along an intermediate portion thereof. The contact is inserted into a plated-through hole on a circuit board so that the ends of the ferrule extend from each side of the circuit board. The ends of the ferrule are then deformed to engage and secure the contact to the circuit board. Sinclair et al, in the '452 patent, discloses an adapter pin having a round knurled end, which is press fit into a plated-through hole on a printed circuit board. To establish a rigid mechanical connection between the pin and the circuit board, the knurled end is configured to have a diameter which is larger than the diameter of the plated-through hole to provide an interference fit resulting in substantial deformation of the hole circumference.

For solderless pin contacts, the electrical contact itself provides both the mechanical support and electrical connection between the contact and a plated-through hole on a printed circuit board. In general, solderless contacts are press-fit into a plated-through hole to both establish an electrical connection and provide mechanical support between the contact and hole. As contact pressure between the contact and hole increases, which can result by increasing the interference between the contact and hole, electrical and support characteristics tend to improve. However, as the contact pressure increases, greater mechanical stresses are placed on the plated-through hole and fiberglass material of the printed circuit board. If the contact pressure becomes too high, the integrity of the plated-through hole can be compromised resulting in failure of the plated-through hole and the printed circuit board.

Solderless pin contacts that have been developed typically include a compliant section to engage a plated-through hole on a circuit board. The purpose of the compliant section is to establish both an electrical connection and mechanical support between the contact and the plated-through hole by exerting sufficient contact pressure on the hole. Examples of compliant pin contacts include U.S. Pat. Nos. 4,443,053; 4,746,301; 4,758,187; 4,776,807; and 4,795,378. Each of these contacts includes a compliant section along a length of the contact having a particular cross-sectional shape which collapses or deforms when inserted into a plated-through hole to attempt to minimize hole distortion. Astbury, in the '053 patent, discloses an electrical contact that includes a compliant section formed having end sections that are slidable relative to a central section when the contact is inserted into a plated-through hole. Key, in the '301 patent, discloses a compliant pin having an S-shaped cross-section. Guglhör, in the '187 patent, discloses a contact pin having a cross-section shaped similar to an I-beam which collapses upon insertion into a plated-through hole. Trainer et al, in the '807 patent, discloses an electrical contact including a compliant section having a U-shaped cross-section which deforms upon insertion into a plated-through hole to create a positive electrical contact. Tomizu et al, in the '378 patent, discloses a terminal pin including a compliant portion having a roughly V-shaped cross-section which deforms inwardly when inserted into a plated-through hole.

Accordingly, there is a need for an electrical contact which can be press-fit into a plated-through hole on a printed circuit board to support the contact in the hole with minimal hole distortion and minimal contact pressure on the hole.

It is an object of the present invention to provide an improved electrical contact for soldering in a plated-through hole on a printed circuit board.

SUMMARY OF THE INVENTION

According to one aspect of the invention, an electrical contact for mounting on a printed circuit board that has a plated-through hole includes a conductive pin, and a base attached to one end of the pin. The base has a triangular cross-section with three sides and three vertices, and is constructed and arranged to be mounted in the plated-through hole on the printed circuit board.

In a preferred embodiment, the base has a triangular cross-section in the shape of an equilateral triangle. In other embodiments, the contact includes a flange disposed between the pin and the base or a stop protruding from the base for supporting and controlling the depth of the contact on a printed circuit board, and a tail attached to an end of the base opposite the pin. In further embodiments, the vertices define an effective diameter for the base that is approximately equal to or greater than the plated-through hole diameter.

According to another aspect of the invention, in a printed circuit board assembly including a printed circuit board having a plated-through hole and an electrical contact mounted in the plated-through hole, the electrical contact includes a conductive pin, and a base attached to one end of the pin. The base is electrically coupled to the hole and has a triangular cross-section with three sides and three vertices.

BRIEF DESCRIPTION OF THE DRAWINGS

It is to be understood that the drawings are for the purpose of illustration only and are not intended as a definition of the limits of the invention. The foregoing and other objects and advantages of the present invention will become apparent with reference to the following detailed description when taken in conjunction with the following drawings in which.

DETAILED DESCRIPTION OF THE INVENTION

Figure 1:
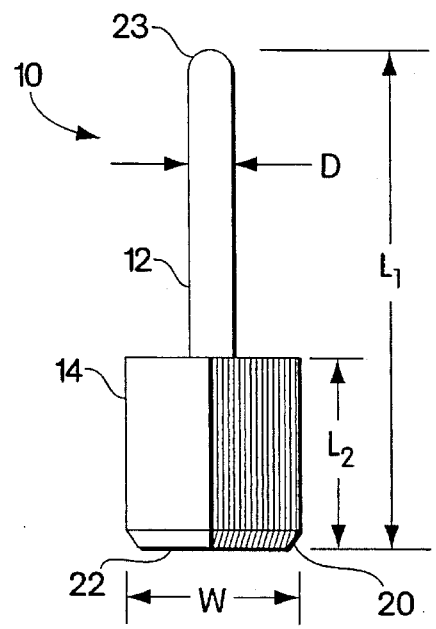
FIG. 1 is a side elevational view of an electrical contact according to an embodiment of the present invention.
Figure 2:
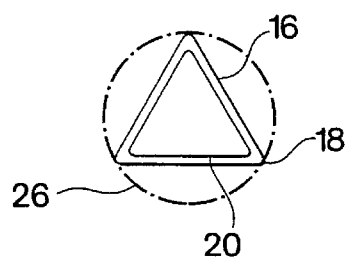
FIG. 2 is a bottom view of the electrical contact of FIG. 1.

The present invention is directed to an electrical pin contact 10, an illustrative embodiment as shown in FIG. 1, which can be mounted on a printed circuit board to provide an electrical interconnection to the printed circuit board. The contact 10 includes an elongated, conductive pin 12, and a base 14 attached to one end of the pin 12, which is mounted in a plated-through hole provided on a printed circuit board. The base 14 has a triangular shape, as shown in FIG. 2, with three sides 16 and three vertices 18 formed at the junction between adjoining sides. Preferably, the base is configured as an equilateral triangle, although other triangular shapes could be used. It is to be appreciated that the sides of the triangular base 14 can have a concave or convex shape between the vertices 18, and the pin can have various cross-sectional shapes, such as circular, square and the like. The vertices 18 and the bottom edges 20 of the sides 16 adjacent the base bottom 22 opposite the pin 12 are rounded or chamfered to ease insertion of the contact into a plated-through hole. Similarly, the tip 23 of the pin is hemispherically shaped for easier mating between the pin and other electronic components, interconnection devices, and the like.

In contrast to conventional compliant pins, the triangular base 14 is a rigid structure having an effective diameter defined by an imaginary circle 26 (FIG. 2) on which each of the vertices 18 is positioned. The effective diameter of the base 14 should be approximately equal to or greater than the diameter of the copper plated-through hole 24 into which the base is inserted to provide a slip fit or an interference fit, respectively, between the base and hole as discussed more fully below and illustrated in FIGS. 3 and 4. A slip fit or interference fit is desirable because the contact is supported in the copper plated-through hole 24 during the soldering process without the need for a manufacturing fixture. Such support tends to enhance the reliability of a solder joint. Additionally, slip and interference fits center the pin 12 relative to the hole with minimal float.

A slip fit (FIG. 3) results from a least material condition (i.e., minimum base width and maximum hole diameter) when the effective diameter of the base 14 is approximately equal to the diameter of the plated-through hole 24. A slip fit essentially is a line-to-line fit between the base and the plated-through hole such that there is no open space between the vertices 18 and the wall 30 of the hole. It is to be appreciated that a base width resulting in an effective base diameter slightly less than the hole diameter also is a slip fit when the base produces sufficient friction between the wall 30 and the vertices 18 to support the contact within the plated-through hole 24 during the soldering process. Furthermore, when a slip fit exists, the vertices 18 do not displace the copper plating of the plated-through hole.

Conversely, an interference fit (FIG. 4) occurs when the effective diameter of the base 14 is greater than the diameter of the plated-through hole 24. Although an interference fit is generally preferred because it provides additional mechanical support for soldering a contact in the plated-through hole 24, an excessive interference fit can damage the plated-through hole 24 and the fiberglass material of the printed circuit board 31. Damage from an excessive interference fit can occur when the electrical contact exerts forces on the plated-through hole that subject the plating or fiberglass material to stresses greater than either can withstand. Factors that can contribute to the amount of induced stress include the amount of interference, the surface area over which the forces are exerted, and the volume of free space between the contact and hole. As the amount of interference between the contact and the hole increases, a greater amount of copper plating is compressed within the hole. Unless the copper is allowed to flow into voids between the contact and the hole, the copper is forced outwardly against the fiberglass board 31, thereby increasing the forces exerted against the hole 24 and the printed circuit board 31. Although plated-through holes are plated with copper, it is to be appreciated that the copper plating itself may be plated or coated with other metals, which can be engaged and displaced by the vertices.

Figure 3:
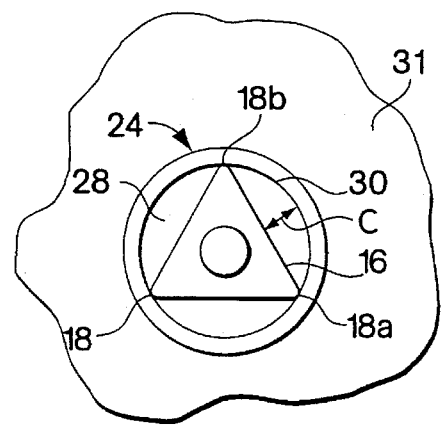
FIG. 3 is a schematic illustration of a slip fit between the electrical contact of FIG. 1 and a plated-through hole on a printed circuit board.
Figure 4:
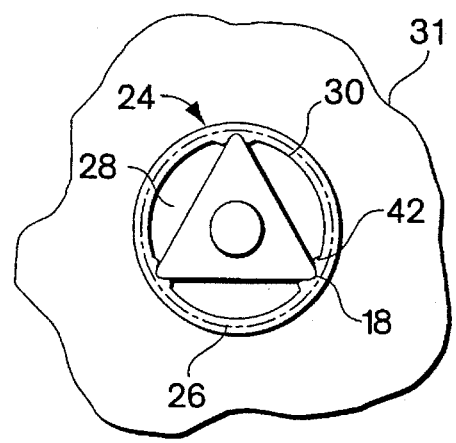
FIG. 4 is a schematic illustration of an interference fit between the electrical contact of FIG. 1 and a plated-through hole on printed circuit board.

As illustrated in FIGS. 3 and 4, insertion of the contact 10 into a plated-through hole 24 forms three channels 28 between the base 14 and the plated-through hole 24. Specifically, each channel 28 is formed by a side 16 of the base, and a portion of the plated-through hole wall 30 that lies opposite and between the vertices 18a, 18b adjacent the base side 16. Each channel 28 provides free space of open volume into which the displaced copper plating 42 (FIG. 4) forming the wall 30 can be compressed and cold flow during the insertion of the base into the hole 24, when an interference fit exists between the base 14 and the wall 30. As the base is inserted into the hole 24, the vertices 18 locally displace the copper plating in a manner that the copper plating 42 cold flows around each of the vertices, thereby minimizing the forces exerted on the hole and providing additional mechanical support for resisting movement of the base. The base 20 should be configured so that under a maximum material condition (i.e., maximum base size and minimum hole diameter), the vertices 18 engage and displace only the copper plating, and do not engage the fiberglass material of the printed circuit board 31 itself. Preferably, the maximum penetration of the vertices into the copper plating should not exceed approximately from 60% to 65% of the plating thickness to avoid physically scoring the fiberglass material and to achieve optimal reliability. The preferred maximum penetration provides a margin of safety to account for plating and hole tolerances. Thus, in a plated-through hole plated with one ounce copper (i.e., 1.4 mils thick), each of the vertices should penetrate the hole wall no more than approximately 0.8 mils to 0.9 mils so that approximately 0.5 mils of copper remains between each of the vertices and the fiberglass material. It is to be appreciated that the copper plating has a thickness tolerance, and the penetration of the vertices varies accordingly.

The channels 28 also provide means for venting gases created during the soldering process, which can also increase the reliability of the solder joint. Flux used in the soldering process and moisture entrapped in the fiberglass material of the printed circuit board can be sources of gases. Conventionally, when a contact is soldered to a printed circuit board, flux is applied to the joint area to enhance the soldering operation. In particular, heat activates the flux to clean the joint. At the same time, however, this process produces residue and volatilized gases that can compromise the integrity of the solder joint unless removed. In addition to activating the flux to clean the joint, heat drives the flux residue and volatile gases from the joint. Unless the gases are allowed to escape from the molten solder before it solidifies, the gases can become entrapped in the solder, thereby creating voids that can reduce the reliability of the solder joint. Accordingly, the channels 28 act as vents that allow the gases and residue to percolate and escape from the joint before the solder solidifies. An equilateral triangular base maximizes the channel width for each of the channels. Preferably, the channel width C, measured from approximately the midpoint of the side 16 between the vertices 18a, 18b to the wall 30 of the plated-through hole, should be approximately 5 mils to 7 mils, which represents a minimal functional channel width C for good venting. It is to be appreciated, however, that the channel width C can be increased or decreased when the plated-through hole diameter, contact size, and hole aspect ratio increase or decrease. In particular, as the hole aspect ratio decreases, i.e., the ratio of the printed circuit board thickness to the diameter of the plated-through hole, the channel width C can be decreased and still provide adequate venting of gases. For example, a channel width less than 5 mils could be used to vent gases from a printed circuit board having a thickness of approximately 0.030 inches.

One embodiment of the electrical contact has a nominal overall length $L_1$ of 0.287 inches, a nominal base length $L_2$ of 0.040 inches, a base width W of 0.036±0.00025 inches, and a pin nominal diameter D of 0.018 inches. Preferably, a contact having this base width should be used with a plated-through hole having a diameter of 0.035±0.001 inches. The contact is made from a brass material, ½ hard composition 22, copper alloy no. 360, plated with a layer of 90% tin/10% lead having a thickness of 0.2 mils, over a layer of nickel having a minimum thickness of 0.05 mils. Furthermore, the electrical contact is preferably manufactured using a screw machine process. It is to be appreciated, however, that the electrical contact can be manufactured to have other dimensions for a particular application, from other materials conventionally used in the electronics industry, and using other known processes.

Figure 5:
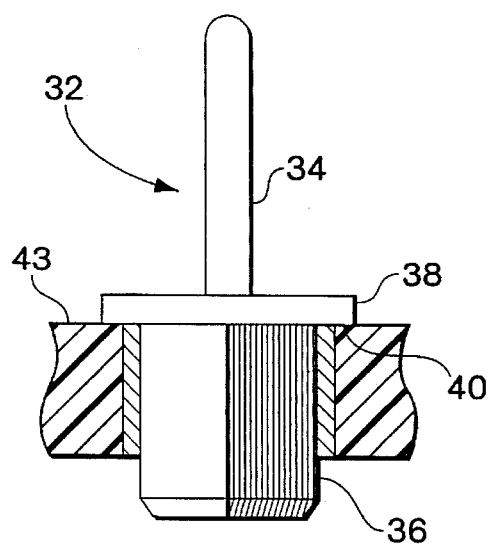
FIG. 5 is a side elevational view of an alternative embodiment of an electrical contact supported in a plated-through hole.
Figure 6:
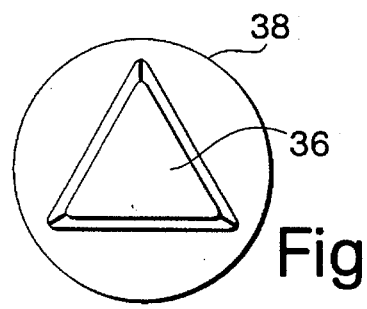
FIG. 6 is a bottom view of the electrical contact of FIG. 5.

In another illustrative embodiment as shown in FIGS. 5 and 6, the electrical contact 32 includes a pin 34, a base 36, and a flange 38 disposed between the pin and base. The pin 34 is an elongated, conductive member extending from one side of the flange 38, and the base 36, which has a triangular cross-section, extends from the opposite side of the flange 38. The flange 38 forms a shoulder 40 to engage a surface of a printed circuit board 43 for supporting the contact and controlling the depth of the contact 32 in a plated-through hole prior to soldering the contact in the plated-through hole. As illustrated, the base 36 extends below the circuit board 43 for wave reflow soldering. However, the base can be configured so that it does not protrude beyond the circuit board so that surface mount components (not shown) could be mounted on a circuit board opposite the pin. It is to be appreciated that other means of soldering the contact can be utilized such as solder preforms between the flange and the printed circuit board, solder paste in the plated-through hole, and the like.

Figure 7:
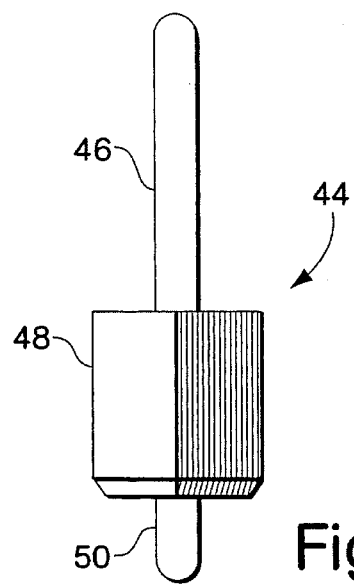
FIG. 7 is a side elevational view of another alternative embodiment of an electrical contact.

Referring to FIG. 7, another illustrative embodiment of an electrical contact 44 includes a pin 46, a triangular base 48 and a tail 50. The pin 46 and tail 50 are elongated, conductive members extending in opposite axial directions from opposite ends of the base 48.

Figure 8:
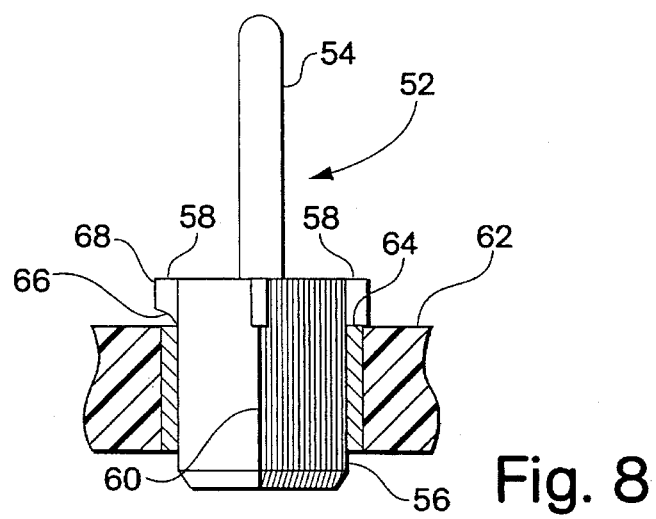
FIG. 8 is a side elevational view of a further alternative embodiment of an electrical contact supported in a plated-through hole.
Figure 9:
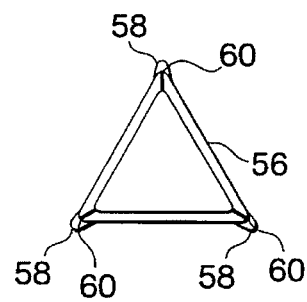
FIG. 9 is a bottom view of the electrical contact of FIG. 8.

As illustrated in FIGS. 8 and 9, another embodiment of an electrical contact 52 includes a pin 54, a base 56, and a plurality of stops 58 protruding from the base. The pin 54 is an elongated, conductive member extending from one side of the base 56, which has a triangular cross-section having three vertices 60. The stops 58 protrude radially outward from each of the vertices 60 to engage a surface of a printed circuit board 62 for supporting the contact and controlling the depth of the contact in a plated-through hole prior to soldering the contact in the plated-through hole. The stops 58 can be formed with a shoulder 64 or a radial rib 66 extending between the base and the stop tip 68 to engage the printed circuit board. Using discrete stops at each of the vertices ensures that the channels 28 (FIGS. 3 and 4) are not covered and that solder gases can be vented during a soldering process.

Having thus described particular embodiments of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited in the following claims and the equivalents thereto.

What is claimed is:

1. An electrical contact for mounting on a printed circuit board that has a plated-through hole, the contact comprising:
    a conductive pin; and
    a base attached to one end of the pin, the base having a triangular cross-section with three sides and three vertices, the base constructed and arranged to be mounted in a plated-through hole on a printed circuit board.
2. The electrical contact recited in claim 1, wherein the base has a triangular cross-section in the shape of an equilateral triangle.

3. The electrical contact recited in claim 1, further comprising a flange disposed between the pin and the base, the flange constructed and arranged to support the contact on the printed circuit board when the base is inserted into the plated-through hole.

4. The electrical contact recited in claim 1, wherein the base has a bottom surface opposite the pin, the base having a chamfer along the bottom surface to lead the base into the plated-through hole.

5. The electrical contact recited in claim 1, wherein the pin is coaxially attached to the base.

6. The electrical contact recited in claim 1, wherein the vertices coaxially align the pin in the plated-through hole.

7. The electrical contact recited in claim 1, wherein the vertices create an interference fit between the base and the plated-through hole.

8. The electrical contact recited in claim 7, wherein the plated-through hole has a first diameter, and the vertices define a second diameter that is greater than the first diameter of the plated-through hole.

9. The electrical contact recited in claim 1, wherein the plated-through hole has a first diameter, and the vertices define a second diameter that is approximately equal to the first diameter of the plated-through hole.

10. The electrical contact recited in claim 1, wherein the base is constructed and arranged to form a solder flow channel between the sides of the base and the plated-through hole, the channel being formed by a side of the base and a portion of the plated-through hole opposite the side and between the vertices adjacent the side.

11. The electrical contact recited in claim 10, wherein the base is constructed and arranged with the sides to be positioned at a distance from the plated-through hole to allow the solder flow channel to vent gases from solder during a soldering process.

12. The electrical contact recited in claim 1, further comprising a tail attached to an end of the base opposite the pin.

13. The electrical contact recited in claim 1, further comprising a stop protruding from the base, the stop adapted to support the contact on the printed circuit board when the base is inserted into the plated-through hole, and control the insertion depth of the base in the plated-through hole.

14. The electrical contact recited in claim 13, wherein a stop protrudes from each of the vertices of the base.

15. In a printed circuit board assembly including a printed circuit board having a plated-through hole, and an electrical contact mounted in the plated-through hole, the electrical contact comprising:

a conductive pin; and a base attached to one end of the pin and electrically coupled to the hole, the base having a triangular cross-section with three sides and three vertices.

16. The electrical contact recited in claim 15, wherein the base has an effective diameter defined by the vertices that is approximately equal to the plated-through hole diameter.

17. The electrical contact recited in claim 15, wherein the base has an effective diameter defined by the vertices that is greater than the plated-through hole diameter.

\* \* \* \* \*